(12) United States Patent
Ciarcia

(10) Patent No.: US 12,085,607 B2
(45) Date of Patent: Sep. 10, 2024

(54) TEST ARRANGEMENT AND METHOD FOR TESTING AN INTEGRATED CIRCUIT

(71) Applicant: Infineon Technologies AG, Neubiberg (DE)

(72) Inventor: Alessio Ciarcia, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/941,025

(22) Filed: Sep. 9, 2022

(65) Prior Publication Data

US 2024/0085471 A1    Mar. 14, 2024

(51) Int. Cl.
    *G01R 31/28* (2006.01)

(52) U.S. Cl.
    CPC ................. *G01R 31/2851* (2013.01)

(58) Field of Classification Search
    CPC .......... G01R 31/2851; G01R 31/31724; G01R 31/31813; G01R 31/3183; G01R 31/318385; G01R 31/31919
    USPC .......... 324/750.3, 762.01–762.3; 714/25, 30, 714/715, 728, 732, 733, 738–739
    See application file for complete search history.

(56) References Cited

U.S. PATENT DOCUMENTS

| | | | | |
|---|---|---|---|---|
| 4,745,355 A * | 5/1988 | Eichelberger | .. | G01R 31/318547 714/728 |
| 6,041,429 A * | 3/2000 | Koenemann | ..... | G01R 31/31813 714/726 |
| 6,543,020 B2 * | 4/2003 | Rajski | ............ | G01R 31/318335 714/738 |
| 6,922,803 B2 * | 7/2005 | Nakao | .................... | G11C 29/10 714/738 |
| 7,519,889 B1 * | 4/2009 | Cervantes | ...... | G01R 31/318385 714/728 |
| 10,088,524 B2 * | 10/2018 | Bhamidipati | .. | G01R 31/318547 |
| 10,649,028 B2 * | 5/2020 | Bhamidipati | .... | G01R 31/31724 |

(Continued)

FOREIGN PATENT DOCUMENTS

| | | | | |
|---|---|---|---|---|
| CN | 105229481 A | * | 1/2016 | ......... G01R 31/2834 |
| JP | 4228061 B2 | * | 2/2009 | ..... G01R 31/318547 |
| WO | WO-0138890 A1 | * | 5/2001 | ....... G01R 31/31813 |

OTHER PUBLICATIONS

Dugonik et al., Seed and Polynomial Selection Algorithm for LFSR Test Pattern Generator in Built-In Self-Test Environment. Informacije MIDEM 34(2004)3, pp. 141-149 (Year: 2004).*

(Continued)

*Primary Examiner* — Giovanni Astacio-Oquendo
(74) *Attorney, Agent, or Firm* — VIERING, JENTSCHURA & PARTNER MBB

(57) ABSTRACT

A test arrangement for testing an integrated circuit is described wherein the test arrangement comprises a test pattern generator configured to generate a sequence of test patterns, a memory storing an indication for each of a plurality of groups of one or more of the test patterns, whether to use the group of test patterns for testing an integrated circuit and a controller configured to, for each of the test patterns, control the test pattern generator to feed the test pattern to the integrated circuit if the test pattern belongs to a group that should be used for testing the integrated circuit and to skip the test pattern in the testing of the integrated circuit if the test pattern belongs to a group that should not be used for testing the integrated circuit.

10 Claims, 4 Drawing Sheets

(56) References Cited

U.S. PATENT DOCUMENTS

| | | | |
|---|---|---|---|
| 10,746,794 B2* | 8/2020 | Bhamidipati | G01R 31/31724 |
| 11,579,185 B2* | 2/2023 | Mishra | G01R 31/318547 |
| 11,585,853 B2* | 2/2023 | Mrugalski | G01R 31/318385 |
| 2002/0073373 A1* | 6/2002 | Nakao | G11C 29/10 714/728 |
| 2003/0120988 A1* | 6/2003 | Rajski | G01R 31/318335 714/726 |
| 2003/0191998 A1* | 10/2003 | Nakamura | G01R 31/3187 714/733 |
| 2004/0187060 A1* | 9/2004 | Rohrbaugh | G01R 31/318378 714/742 |
| 2007/0283204 A1* | 12/2007 | Swaminathan | G01R 31/31813 714/733 |
| 2016/0003900 A1* | 1/2016 | Narayanan | G01R 31/318566 714/726 |
| 2017/0192054 A1* | 7/2017 | Bhamidipati | G01R 31/3187 |
| 2017/0192055 A1* | 7/2017 | Bhamidipati | G01R 31/318547 |
| 2017/0192057 A1* | 7/2017 | Bhamidipati | G01R 31/31724 |
| 2018/0120373 A1* | 5/2018 | Glaeser | H01L 22/14 |
| 2021/0156918 A1* | 5/2021 | Mrugalski | G01R 31/318536 |
| 2023/0184821 A1* | 6/2023 | Su | G01R 31/2834 714/724 |

OTHER PUBLICATIONS

V.M. Thoulath Begam, A new seed finding algorithm for testing VLSI circuits. International Advanced Research Journal in Science, Engineering and Technology. vol. 4, Issue 10, Oct. 2017. (Year: 2017).*

Shailaja et al., Automatic Seed Generation for Weighted Test Pattern Generation. Proceedings of the International Conference on Augmented Intelligence and Sustainable Systems (ICAISS-2022). IEEE 2022. (Year: 2022).*

* cited by examiner

FIG 1

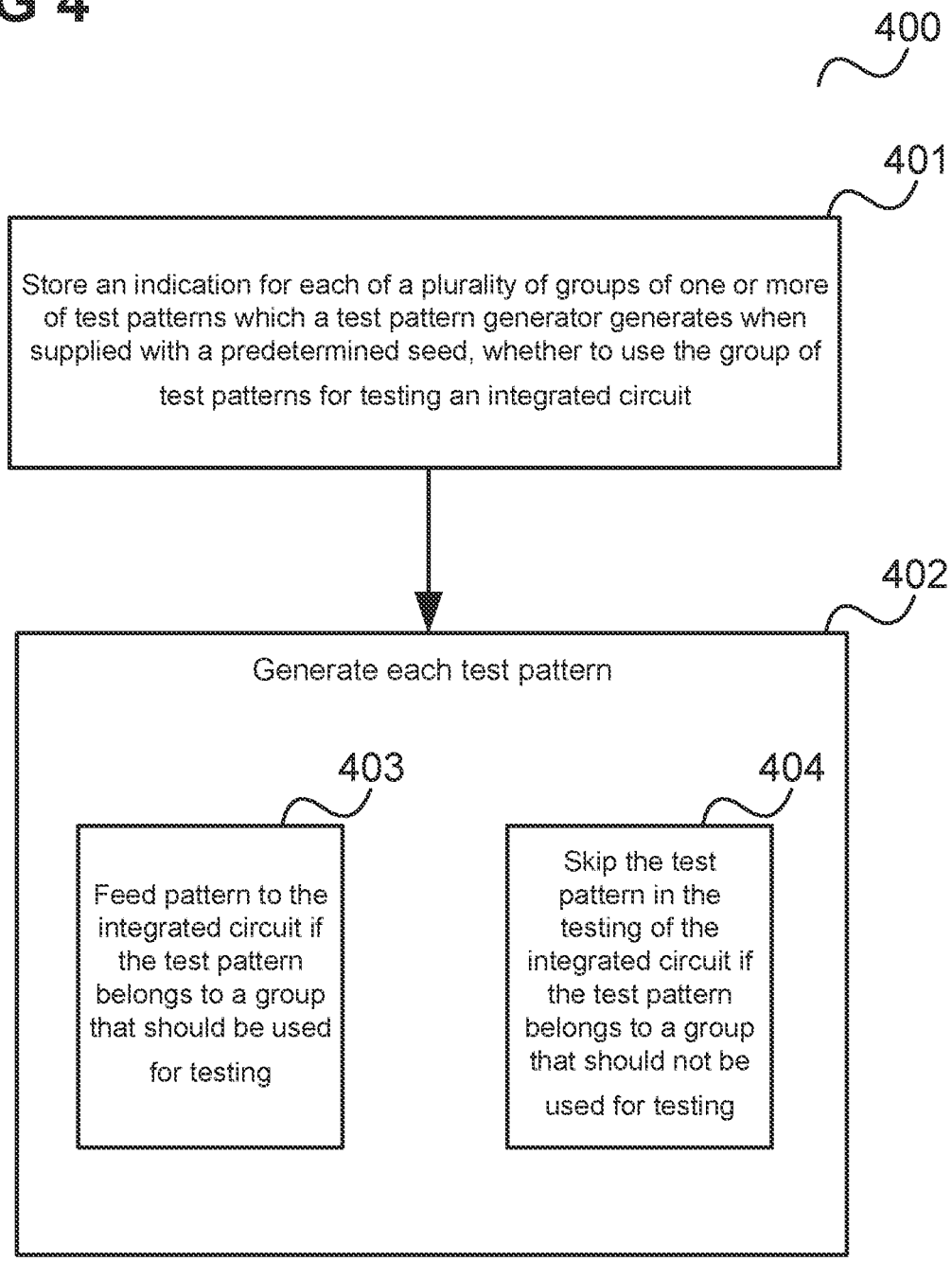

US 12,085,607 B2

TEST ARRANGEMENT AND METHOD FOR TESTING AN INTEGRATED CIRCUIT

TECHNICAL FIELD

Exemplary implementations described herein generally relate to test arrangements and methods for testing an integrated circuit.

BACKGROUND

Integrated circuits, for example microcontrollers (MCUs) such as those used in vehicles, must meet high quality standards. In particular, functional safety standards require high coverage (up to 90% or even 99%). To achieve such a test coverage, a high number of test patterns are typically generated and loaded into an integrated circuit to be tested. The generation of the test patterns is typically done in a pseudo-random manner, e.g. by means of a linear feedback shift register. This, however, leads to relatively low test efficiency since tests are performed for test patterns which do not add to the test coverage because one or more test patterns which already covered the same test cases have been generated and used for testing.

Therefore, approaches are desirable that increase the efficiency of testing using pseudo-randomly generated test patterns.

SUMMARY

According to various embodiments, a test arrangement for testing an integrated circuit is provided wherein the test arrangement includes a test pattern generator configured to generate, from a predetermined seed, a sequence of test patterns, a memory storing an indication for each of a plurality of groups of one or more of the test patterns, whether to use the group of test patterns for testing an integrated circuit and a controller configured to, for each of the test patterns, control the test pattern generator to feed the test pattern to the integrated circuit if the test pattern belongs to a group for which the indication stored for the group indicates that the test patterns of group should be used for testing the integrated circuit and to skip the test pattern in the testing of the integrated circuit if the test pattern belongs to a group for which the indication stored for the group indicates that the test patterns of group should not be used for testing the integrated circuit.

According to a further embodiment, a method for testing an integrated circuit according to the test arrangement described above is provided.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects are described with reference to the following drawings, in which:

FIG. 1 shows an integrated circuit according to one embodiment.

FIG. 4 shows a flow diagram illustrating a method for testing an integrated circuit.

DESCRIPTION OF EXEMPLARY IMPLEMENTATIONS

Figure 2:
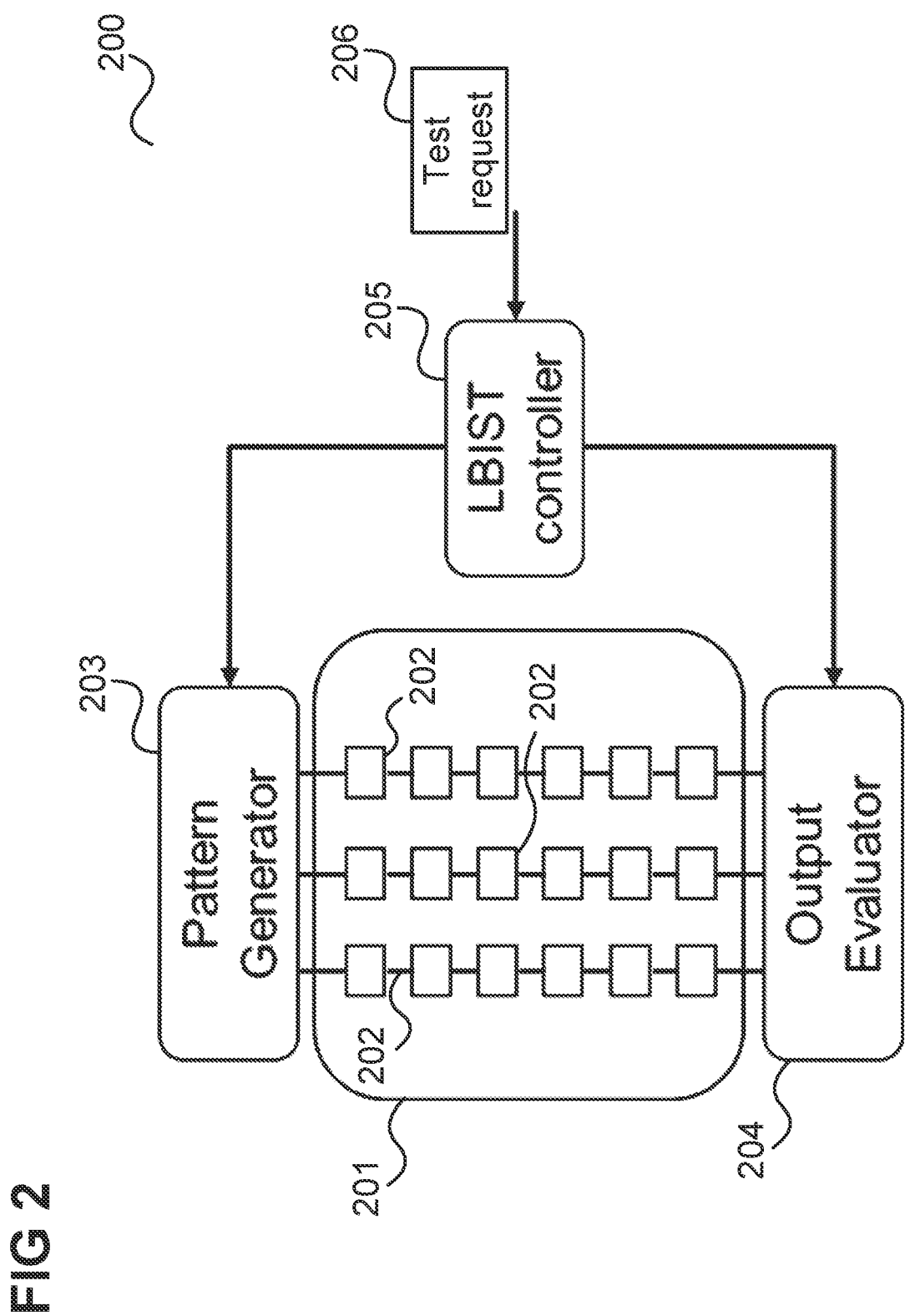
FIG. 2 shows a test arrangement for testing an integrated circuit.

The following detailed description refers to the accompanying drawings that show, by way of illustration, specific details and aspects of this disclosure in which the invention may be practiced. Other aspects may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

Figure 1:
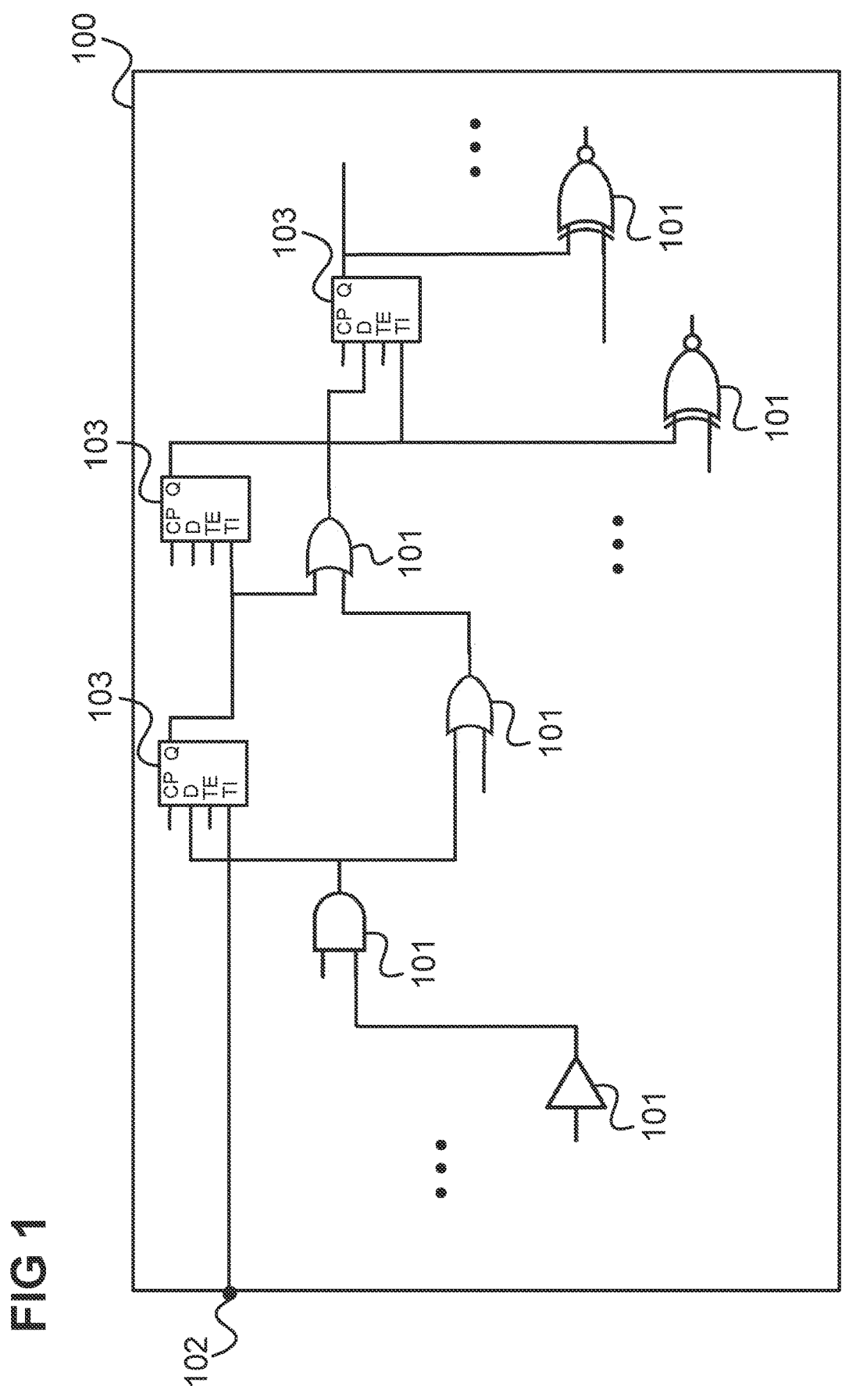

FIG. 1 shows an integrated circuit (or chip) 100 according to one embodiment.

The integrated circuit 100 is, for example, a microcontroller, e.g., for an ECU (electronic control unit) in a vehicle, or as a smart card module for a smart card of any form factor.

As is typically the case, the integrated circuit 100 has a plurality of logic gates 101 (AND gates, NON-OR gates, exclusive-OR gates, inverters . . . ) interconnected by interconnection lines. The logic gates 101 are cells from a chip design library and they may be more complex circuits (e.g., complex gates).

The integrated circuit also has flip-flops 103 connected to the logic gates 101. At least some of the flip-flops 103 are provided as scan flip-flops to allow test patterns to be loaded into the scan flip-flops for testing the integrated circuit. A scan flip-flop is a D flip-flop with a multiplexer added at the input, where one input of the multiplexer functions as a function input D and the other input serves as a test input (TI). The flip-flops 103 are interconnected to form a chain by connecting the output of each scan flip-flop 103 (except for the last of the chain) to the input of a subsequent scan flip-flop 103. The input of the first scan flip-flop 103 of the chain is connected to a test input pin 102. CP denotes the clock input (connected to a clock signal line not shown for simplicity). A test pattern is pushed into the chain of scan flip-flops 103 (each via the test input) via the test input pin 102. A test enable signal supplied to a test enable input (TE, connection to test enable signal line not shown for simplicity) switches the multiplexer of the scan flip-flop from the data input (D) to the test input (TI) for testing.

When a test pattern has been loaded into the integrated circuit it is processed by the integrated circuit, results of the processing are captured into the same or other flip-flops and read out of the integrated circuit for evaluation.

The test pattern which is pushed into the flip-flops 103 is generated by a test pattern generator. This is illustrated in FIG. 2.

FIG. 2 shows a test arrangement 200 for an integrated circuit (chip) 201.

The chip 201 includes a plurality of scan flip-flop chains 202 as explained with reference to FIG. 1.

A test pattern generator 203 sequentially generates test patterns and supplies them to the scan flip-flops chains 202 via test input pins. It should be noted that as used in the following, a test pattern means a pattern for a test iteration which provides bit values for all scan flip-flops to be loaded in that test iteration. For example, a test pattern includes bits (test values) for all three scan flip-flop chains 202 in the example of FIG. 2.

In the example of FIG. 2, it is assumed that results of the processing of the test patterns are captured by the scan flip-flop chains 202 themselves (rather than dedicated observation flip-flops) via their D inputs and read out via test output pins by shifting them out of the chip 201 into an output evaluator 204 which determines whether the captured results correspond to the correct (reference) results. Test results may be compressed using an output compactor, e.g. a MISR (Multiple Input Signature Register).

A test controller 205, a LBIST (Logic Built-In Self Test) controller in this case, controls the test pattern generator 203 and the output evaluator 204. The LBIST controller 205 starts a test in response to a test request message 206 (e.g. sent by an ECU upon start-up of a car).

The test pattern generator 203 is typically a linear feedback shift register (LF SR) which pseudo-randomly generates test patterns (when instructed to do so by the LBIST controller 205). An LSFR allows fast test pattern generation but has low test pattern efficiency (i.e. low ATPG (automatic test pattern generation) efficiency). This is because a test pattern that is generated and used for testing may not differ sufficiently from a test pattern generated and used earlier to test for a different fault (i.e. it is redundant in the sense that it does not add to the test coverage). Such a test pattern is thus not effective.

For example, when testing a chip in a car upon turning on the electronic system of the car (keyon test) and when testing upon turning of the electronic system of the car (keyoff test) it is possible that hundreds or thousands of patterns (of several thousand generated patterns) are ineffective. It should be noted that LBIST tests are typically also used to test devices during their whole lifetime (like key-off and key-on test for automotive products).

Testing with the test patterns which are not effective wastes testing time (in terms of clock cycles of the chip 200) according to

[wasted cycles=(max_chain_length+capture_cycles)*number_of_ineffective_patterns]

which leads, in a typical testing scenario for a car, to tens or hundreds of thousands of useless testing clock cycles for a keyoff test or a keyon test assuming as an example a pattern that requires 100 clock cycles for testing. Besides the loss of time (and e.g. increasing the starting time for the car) this also leads to wasted power since flip-flops are switched unnecessarily.

In view of the above, according to various embodiments a (possibly programmable) logic is provided (e.g. included in the LBIST controller 205) which allows skipping ineffective patterns.

Figure 3:
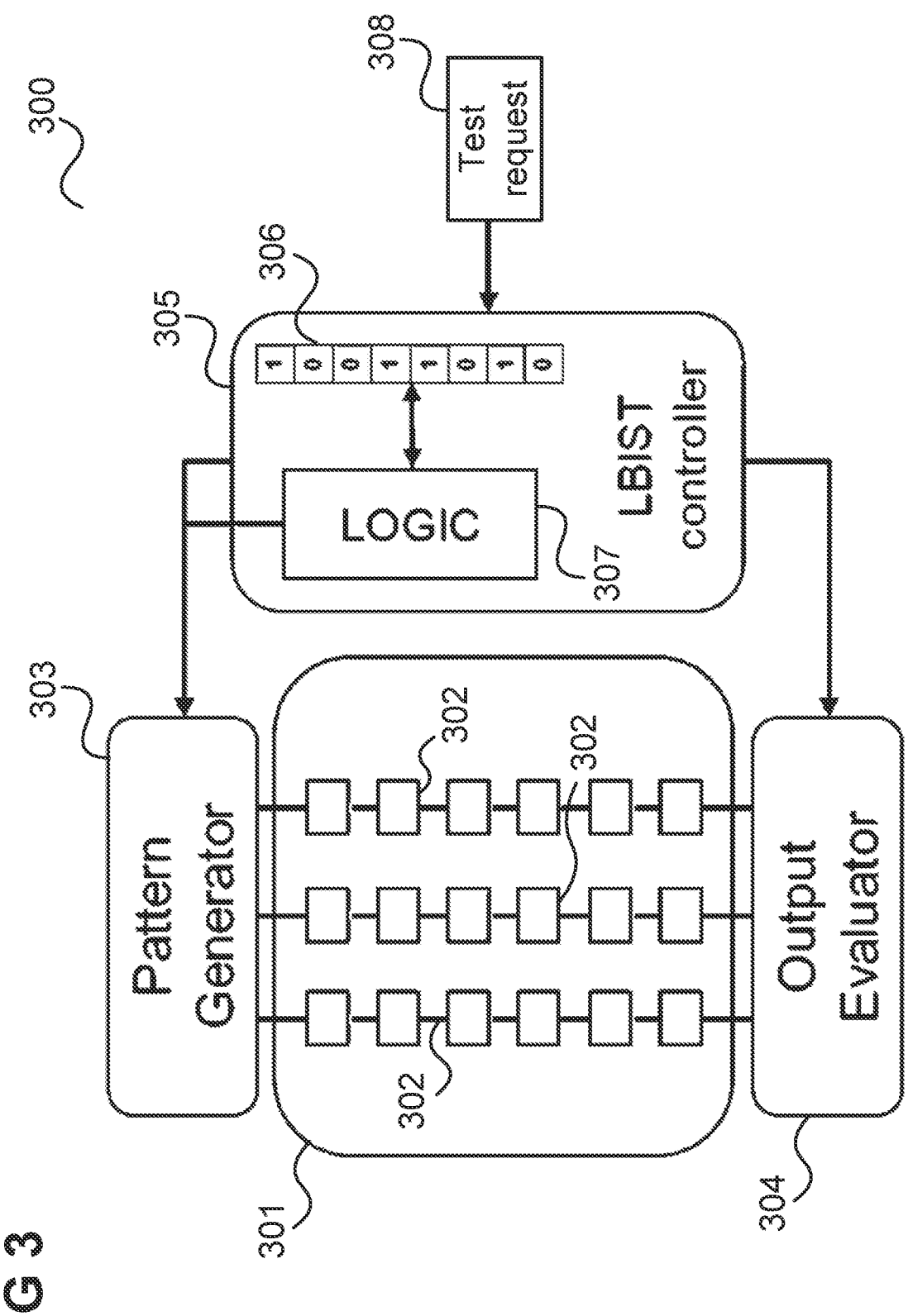
FIG. 3 shows a test arrangement according to an embodiment.

FIG. 3 shows a test arrangement 300 according to an embodiment.

Similarly to FIG. 2, a chip 301 including scan flip-flop chains 302 is tested by being supplied with test patterns supplied by a test pattern generator 303 and the results being evaluated by an output evaluator 304, wherein the test pattern generator 303 and the output evaluator 304 are controlled by a test (LBIST) controller 305.

The LBIST controller 305 stores a list of flags 306 (or in general indications; stored in a memory of the test controller 305) which is used by a control logic 307 of the LBIST controller 305. The LBIST controller 305 starts a test in response to a test request message 308 (e.g. sent by an ECU upon start-up of a car).

The test pattern generator 303 generates a sequence of test patterns for a seed. The list of flags 306 indicates which of these test patterns should be used for testing, i.e. which of these test patterns should be fed to the chip 301 for processing by the chip 301 an evaluation of the processing results.

The flags may indicate this individually for test patterns but also for group of test patterns with more than one test pattern. For example, the sequence of test patterns is grouped into groups of consecutive test patterns (e.g. each group has 1 to 16 test patterns, where all groups have for example the same size) resulting in a sequence of groups and the list of flags has a flag for each group indicating whether the group should be used for testing. For example, if the flag has the value 0 the group should not be used (i.e. should be skipped) and if the flag has the value 1 the group should be used, i.e. each test pattern of the group is used for testing (i.e. fed to the chip, processed by the chip 201 and the processing results are evaluated).

By skipping test patterns which are ineffective (or groups which include a high number of ineffective test patterns) is it possible to avoid useless test iterations.

It should be noted that, according to various embodiments, e.g. in case the test pattern generator is an LSFR, the test pattern generator 303 generates a test pattern even if it is skipped. However, when a test pattern is skipped, the test pattern generator 303 does not load the scan flip-flop chains 302, thus in particular saving power. Further, the LF SR may be run faster until the next efficient test pattern (i.e. a test pattern that should not be skipped) is reached.

As an example to skip test patterns, since the LBIST controller 205, to run a normal LBIST run, typically contains already the information about the number of shift and capture cycles (so it knows every test pattern duration), it may skip N pattern by using a cycle counter programmed to count N*pattern_duration cycles before loading the chains again. This does not depend on the speed of the LFSR so it is still possible that the LFSR may be run faster (i.e. with a shorter cycle period) when skipping patterns.

According to various embodiments, a method is provided as illustrated in FIG. 4.

FIG. 4 shows a flow diagram 400 illustrating a method for testing an integrated circuit.

In 401, for each of a plurality of groups of one or more of test patterns which a test pattern generator generates when supplied with a predetermined seed, an indication is stored whether to use the group of test patterns for testing an integrated circuit.

In 402 the test patterns are generated wherein, for each of the test patterns, the test pattern is fed to the integrated circuit in 403 if the test pattern belongs to a group for which the indication stored for the group indicates that the test patterns of group should be used for testing the integrated circuit and the test pattern is skipped in the testing of the integrated circuit in 404 if the test pattern belongs to a group for which the indication stored for the group indicates that the test patterns of group should not be used for testing the integrated circuit.

The approach of FIG. 4 allows increasing test coverage because if inefficient patterns are skipped testing time is freed for additional (effective) test patterns. Also, if test coverage by using only efficient patterns is sufficient test time may be reduced. Power may be saved since flip-flop chains are not loaded and flip-flops are not switched for ineffective patterns.

The method may be performed by one or more processors. A "processor" may be understood as any kind of a logic implementing entity, which may be special purpose circuitry or a processor executing software stored in a memory, firmware, or any combination thereof. Thus a "processor"

may be a hard-wired logic processor or a programmable logic processor such as a programmable processor, e.g. a microprocessor. A "processor" may also be a processor executing software, e.g. any kind of computer program. Any other kind of implementation of the respective functions which are described herein in more detail may also be understood as a "processor". The following examples pertain to further exemplary implementations.

Embodiment 1 is a test arrangement for testing an integrated circuit, wherein the test arrangement includes a test pattern generator configured to generate, from a predetermined seed, a sequence of test patterns; a memory storing an indication for each of a plurality of groups of one or more of the test patterns, whether to use the group of test patterns for testing an integrated circuit, a controller configured to, for each of the test patterns, control the test pattern generator to feed the test pattern to the integrated circuit if the test pattern belongs to a group for which the indication stored for the group indicates that the test patterns of group should be used for testing the integrated circuit and to skip the test pattern in the testing of the integrated circuit if the test pattern belongs to a group for which the indication stored for the group indicates that the test patterns of group should not be used for testing the integrated circuit.

Embodiment 2 is the test arrangement of Embodiment 1, wherein the test pattern generator is configured to, for each test pattern of the sequence of test patterns but the last of the test patterns, generate the test pattern, feed the generated test pattern to the integrated circuit and, after feeding the generated test pattern to the integrated circuit, generate the next test pattern of the sequence of test patterns if the controller controls the test pattern generator to feed the generated test pattern to the integrated circuit.

Embodiment 3 is the test arrangement of Embodiment 2, wherein the test pattern generator is configured to, for each test pattern of the sequence of test patterns but the last of the test patterns, generate the test pattern and to generate, without feeding the generated test pattern, the next test pattern of the sequence of test patterns if the controller controls the test pattern generator to skip the test pattern in the testing of the integrated circuit.

Embodiment 4 is the test arrangement of any one of Embodiments 1 to 3, wherein the controller configured to, for each of the test patterns, check whether the test pattern belongs to a group for which the indication stored for the group indicates that the test patterns of group should be used for testing the integrated circuit.

Embodiment 5 is the test arrangement of any one of Embodiments 1 to 4, wherein each group includes a single test pattern.

Embodiment 6 is the test arrangement of any one of Embodiments 1 to 4, wherein each group includes multiple test patterns.

Embodiment 7 is the test arrangement of any one of Embodiments 1 to 6, wherein the indications are flags of a sequence of flags.

Embodiment 8 is the test arrangement of any one of Embodiments 1 to 7, wherein the groups are groups of consecutive test patterns in the sequence of test patterns.

Embodiment 9 is the test arrangement of any one of Embodiments 1 to 8, wherein the test pattern generator is a linear feedback shift register.

Embodiment 10 is a method for testing an integrated circuit as illustrated in FIG. 4.

It should be noted that one or more of the features of any of the examples above may be combined with any one of the other examples.

While specific aspects have been described, it should be understood by those skilled in the art that various changes in form and detail may be made therein without departing from the spirit and scope of the aspects of this disclosure as defined by the appended claims. The scope is thus indicated by the appended claims and all changes which come within the meaning and range of equivalency of the claims are therefore intended to be embraced.

REFERENCE SIGNS 100 integrated circuit
101 logic gates
102 test input pins
103 flip-flops
200 Test arrangement
201 Integrated circuit
202 Scan flip-flop chains
203 Test pattern generator
204 Output evaluator
205 Test controller
206 Test request
300 Test arrangement
301 Integrated circuit
302 Scan flip-flop chains
303 Test pattern generator
304 Output evaluator
305 Test controller
306 List of flags
307 Control logic
308 Test request
400 flow diagram
401-404 processing

The invention claimed is:

1. A test arrangement for testing an integrated circuit, wherein the test arrangement comprises:
a test pattern generator configured to generate, from a predetermined seed, a sequence of test patterns;
a memory storing an indication for each of a plurality of groups of two or more test patterns of the sequence of test patterns, whether to use the each of the plurality of groups for testing the integrated circuit; and
a controller configured to, for each of the test patterns of the plurality of groups, control the test pattern generator to feed the test pattern to the integrated circuit if the test pattern belongs to a group for which the indication stored for the group indicates that the test patterns of group should be used for testing the integrated circuit and to skip the test pattern in the testing of the integrated circuit if the test pattern belongs to a group for which the indication stored for the group indicates that the test patterns of group should not be used for testing the integrated circuit;
wherein each group comprises multiple test patterns.

2. The test arrangement of claim 1, wherein when the controller controls the test pattern generator to feed a test pattern generated by the test pattern generator to the integrated circuit, the test pattern generator is configured to, for each test pattern of the sequence of test patterns but the last of the test patterns, generate the test pattern, feed the generated test pattern to the integrated circuit and, after feeding the generated test pattern to the integrated circuit, generate the next test pattern of the sequence of test patterns.

3. The test arrangement of claim 1, wherein when the controller controls the test pattern generator to skip the test pattern in the testing of the integrated circuit the test pattern generator is configured to, for each test pattern of the sequence of test patterns but the last of the test patterns, generate the test pattern and to generate, without feeding the generated test pattern, the next test pattern of the sequence of test patterns.

4. The test arrangement of claim 1, wherein the controller configured to, for each of the test patterns, check whether the test pattern belongs to a group for which the indication stored for the group indicates that the test patterns of group should be used for testing the integrated circuit.

5. The test arrangement of claim 1, wherein the indications are flags of a sequence of flags.

6. The test arrangement of claim 1, wherein the groups are groups of consecutive test patterns in the sequence of test patterns.

7. The test arrangement of claim 1, wherein the test pattern generator is a linear feedback shift register.

8. The test arrangement of claim 1, wherein the test pattern generator is configured to generate a plurality of test patterns; wherein the plurality of test patterns corresponds to a group of the plurality of groups of test patterns.

9. The test arrangement of claim 1, further comprising a counter, configured to count increments corresponding to a duration of a test pattern cycle; wherein the controller is further configured to cause a predetermined number of test patterns not to be fed to the integrated circuit based on a number of count increments of the counter.

10. A method for testing an integrated circuit, comprising:
storing an indication for each of a plurality of groups of two or more of test patterns which a test pattern generator generates when supplied with a predetermined seed, whether to use the group of test patterns for testing the integrated circuit;
generating the test patterns and, for each of the test patterns, feeding the test pattern to the integrated circuit if the test pattern belongs to a group for which the indication stored for the group indicates that the test patterns of group should be used for testing the integrated circuit; and
skipping the test pattern in the testing of the integrated circuit if the test pattern belongs to a group for which the indication stored for the group indicates that the test patterns of group should not be used for testing the integrated circuit;
wherein each group comprises multiple test patterns.

* * * * *